United States Patent [19]

Cooper et al.

[11] Patent Number: 5,242,857
[45] Date of Patent: Sep. 7, 1993

[54] METHOD OF MANUFACTURING SEMICONDUCTOR STRUCTURES

[75] Inventors: David M. Cooper, Ipswich; Andrew W. Nelson, Felixstowe; Simon Cole, Ipswich; Ian F. Lealman, Ipswich; William J. Devlin, Ipswich, all of England

[73] Assignee: British Telecommunications public limited company, London, England

[21] Appl. No.: 824,869

[22] Filed: Jan. 22, 1992

Related U.S. Application Data

[63] Continuation of Ser. No. 197,829, May 17, 1988, abandoned.

[30] Foreign Application Priority Data

Sep. 22, 1986 [GB] United Kingdom ............... 8622767

[51] Int. Cl.⁵ .............................................. H01L 21/20
[52] U.S. Cl. ................................... 437/129; 437/133
[58] Field of Search ............................. 437/129, 133

[56] References Cited

U.S. PATENT DOCUMENTS

| | | | |
|---|---|---|---|
| 4,276,098 | 6/1981 | Nelson et al. | 437/129 |
| 4,371,966 | 2/1983 | Scifres et al. | 372/46 |
| 4,496,403 | 1/1985 | Turley | 437/133 |
| 4,509,996 | 4/1985 | Greene et al. | 437/129 |
| 4,542,511 | 9/1985 | Goodfellow et al. | 372/46 |
| 4,595,454 | 6/1986 | Dautremont-Smith et al. | 437/129 |
| 4,660,208 | 4/1987 | Johnston, Jr. et al. | 437/129 |
| 4,701,927 | 10/1987 | Naka et al. | 372/46 |
| 4,701,995 | 10/1987 | Dolan et al. | 437/129 |
| 4,719,633 | 1/1988 | Yoshikawa et al. | 372/45 |
| 4,737,961 | 4/1988 | Mori et al. | 372/46 |
| 4,774,554 | 9/1988 | Dentai et al. | 357/17 |
| 4,788,159 | 11/1988 | Smith | 437/129 |
| 4,852,110 | 7/1989 | Fujii et al. | 372/46 |
| 4,864,581 | 9/1989 | Nelson et al. | 437/129 |
| 4,888,624 | 12/1989 | Johnston, Jr. et al. | 437/129 |

FOREIGN PATENT DOCUMENTS

| | | |
|---|---|---|
| 0039886 | 11/1981 | European Pat. Off. . |
| 0188147 | 7/1986 | European Pat. Off. . |
| 3502326 | 8/1985 | Fed. Rep. of Germany . |
| 0127392 | 7/1983 | Japan ............... 437/129 |
| 0181589 | 10/1984 | Japan ............... 437/129 |
| 8700348 | 1/1987 | PCT Int'l Appl. . |

OTHER PUBLICATIONS

Journal of Lightwave Technology, vol. LT1 No. 1, 1983, p. 195; by Mito et al.
Applied Physics Letters, vol. 44, No. 10, May 1984, American Institute of Physics, New York, US-K. Imanaka et al: "A novel technique to fabricate GaInAsP/InP buried heterostructure laser diodes", pp. 975-977.
Journal of Quantum Electronics, vol. QE-17, No. 5, May 1981, IEEE, (New York, US) S. A. Arai et al: "1.6 um wavelength GaInAsP/InP BH lasers", pp. 640-645.

Primary Examiner—Olik Chaudhuri
Assistant Examiner—Ramamohan Rao Paladugu
Attorney, Agent, or Firm—Nixon & Vanderhye

[57] ABSTRACT

In a semiconductor buried heterostructure laser having a mesa (2, 3, 4) and confinement layers (5, 6, 7) on a substrate (12), at least the lowermost of the confinement layers (5, 6, 7) is substantially planar up to the mesa. This is achieved by MOVPE growth of InP against lateral surfaces of the mesa (2, 3, 4) which are defined by distinct crystallographic planes of the material of the mesa. In particular (111) B InP planes are used. The laser is particularly for use in the field of optical communications.

13 Claims, 10 Drawing Sheets

METHOD OF MANUFACTURING SEMICONDUCTOR STRUCTURES

This is a continuation of application Ser. No. 07/197,829, filed May 17, 1988, now abandoned.

The present invention relates to semiconductor structures. It finds particular application in the field of opto-electronic devices such as semiconductor lasers, and their manufacture.

A known family of opto-electronic devices, buried heterostructure (BH) semiconductor lasers, is based on the following general structure: a substrate of semiconductor material having a mesa thereon, with confinement layers on either side of the mesa. Such a device is described by O Mikami et al in "1.5 μm GaInAsP/InP Buried Heterostructure Lasers Fabricated by Hybrid Combination of Liquid- and Vapour-Phase Epitaxy", Electronics Letters, 18 (5) (4.3.82) pages 237-239. (The word "mesa" in this context is used to describe an upstanding stripe having a flat top.)

The devices of the family include a planar p-n junction across which current flows (the conventional current from p to n) and a waveguide region adjacent to the junction to which light is confined. The waveguide region may comprise an "active layer" in which electrons and holes combine with the production of photons by radiative recombination. Such an active layer has to relate suitably in band gap and refractive index to the other semiconductor regions of the structure in order to achieve a suitable degree of "confinement" of these processes to the active layer. The layers of material to either side of the waveguide region and in contact with the opposite faces of the waveguide region are shown as "confinement layers".

A major field of application of semiconductor optical devices is in optical fibre communications systems. In general, the devices are constructed out of materials whose elemental components are selected from Groups III and V of the Periodic Table. Silica optical fibres as produced in recent years have loss minima at 1.3 μm and 1.55 μm approximately, the latter minimum being the lower. Accordingly, there is an especial need for devices operating in the range from 1.1 to 1.65 μm, especially from 1.3 to 1.6 μm. (These wavelengths, like all the wavelengths herein except where the context indicates otherwise, are in vacuo wavelengths). Semiconductor lasers operating in this region of the infrared usually comprise regions of indium phosphide, InP, and of quaternary materials indium gallium arsenide phosphides, $In_xGa_{1-x}As_yP_{1-y}$. By suitable choices of x and y it is possible to lattice-match the various regions while varying the band gaps of the materials. (Band gaps can be determined experimentally by, for example, photoluminescence). Additionally, both indium phosphide and the quaternary materials can be doped to be p- or n-type as desired.

Describing a selected BH semiconductor laser, with its mesa uppermost, it has an active layer within the mesa. Electrical contacts are provided to the mesa and on the furthermost face of the substrate from the mesa. The "confinement" required is provided optically in a vertical direction, by changes in refractive index of the semiconductor material, and both optically and electrically in a horizontal direction by the confinement layers. The confinement layers act to cause any current flowing between the contacts to flow preferentially through the mesa and therefore through the active layer. In one form, the confinement layers may present non-conducting semiconductor junctions to current flow between the contacts in use of the device.

Good electrical confinement is provided if the semiconductor layers between the contacts constitute a p-n junction and the confinement layers in combination with the substrate constitute an n-p-n junction when taken in the same direction. In use the confinement layers and substrate then comprise a reverse biased semiconductor junction in both directions. Alternatively the confinement layers and substrate could present multiple reverse biased semiconductor junctions in one or both directions.

In another form, the confinement layers may comprise "semi-insulating" materials such as Fe doped InP. These materials have a relatively high resistivity compared to for instance undoped InP. Confinement layers in this form have advantages in that they substantially completely oppose current flow and show low capacitance effects. Low capacitance effects tend to increase device speed.

In the past devices of this type have been fabricated by means of liquid phase epitaxy (LPE). However there are problems associated with these techniques such as solutal convection within the melts, inaccurate thickness control of the confinement layers and meltback of the mesas during fabrication. These have lead in particular to lack of uniformity over large areas and the techniques do not lend themselves easily to large scale production.

In an attempt to solve the problem of meltback of the mesas during fabrication an LPE-VPE (vapour phase epitaxy) hybrid technique has been used. However there are still disadvantages. It retains an LPE growth step and therefore does not lend itself to large scale production, a significant leakage current has been observed in the confinement layers, and narrow mesas are difficult or impossible to achieve.

An alternative growth technique, metal organic vapour phase epitaxy (MOVPE), has been found promising for large scale device production. It offers a highly desirable combination of features: atomic scale interface abruptness, precise compositional control, and uniformity of thickness and composition over a large area.

Additional alternative growth techniques which have also been found advantageous in epitaxial fabrication processes are molecular beam epitaxy (MBE) and metal organic molecular beam epitaxy (MOMBE).

A method of fabricating buried mesa structure lasers using only low pressure "metalorganic chemical vapour deposition" (LP-MOCVD) epitaxial growth steps is outlined in the following paper: "Very Low Threshold Buried Ridge Structure Lasers Emitting at 1.3 am Grown by Low Pressure Metalorganic Chemical Vapour Deposition" by M Razeghi et al, Applied Physics Letters, 46 (2) (15.1.85) pages 131-133. (MOCVD is an alternative term for MOVPE.) The method comprises the steps of growing onto an InP substrate, an n-doped InP buffer layer, an undoped GaInAsP active layer, and a p-doped InP layer for avoiding the formation of defects near the active layer during etching. Etching using a mask, the active layer is reduced to a mesa. After removing the mask, the mesa is covered by a p-doped InP layer and a p-doped GaInAs cap layer.

All the growth steps of the above method are performed by low pressure MOVPE and hence large scale production should be facilitated. Further it is particularly convenient since only one growth technique must be employed. However, the devices produced rely on a built-in potential difference between the large area p-n homo-junctions to each side of the active region and the p-n heterojunction through the relatively small area active region itself. Although a lowest measured threshold current of 11 mA using continuous wave operation has been quoted, the values given for measurements relating to 269 devices were variable in the range from 17.9 mA to 50.0 mA inclusive. 44% of these devices had a threshold current of more than 45 mA. An optical power emission of only up to 15 mW is quoted, and current blocking on either side of the mesa had to be improved by proton bombardment to the depth of the p-n junction and beyond. Such bombardment is not easy to carry out with satisfactory results.

It is an object of the present invention to provide an improved semiconductor structure and a method of manufacture therefor.

Hereinafter, structures and devices may be described in terms, such as "uppermost", which imply a specific orientation of the structure or device. The use of such terms is for convenience of description only and should not be taken to limit any structure or device to a specific orientation.

According to a first aspect of the present invention there is provided a semiconductor stucture, comprising a substrate having epitaxial layers deposited thereon, there being an interface which extends in a generally transverse direction with respect to the face of the substrate, between first and second regions of the layers, wherein at least a major portion of the interface corresponds at least substantially to a (111) B crystallographic plane of the material or materials of the first region, the layers of the first and second regions being at least substantially flat right up to the interface.

It has been found that, surprisingly, it is possible to grow layers in the second region, against such an interface, which tend to show no significant change in depth even immediately adjacent the interface. This means that relatively good control may be exercised over the positions of, for instance, transitions from one layer to the next in the first and second regions, even at the interface. Hence the relative positions of semiconductor junctions can be better controlled at the interface if layers of each region are appropriately doped.

Particularly advantageously, it has been found that such semiconductor structures can be fabricated using MOVPE growth techniques, having the advantages described above.

It has been thought that the layers referred to grow so flat against the interface because of the phosphorous-rich nature of (111) B crystallographic planes of InP. However it has further been found, surprisingly, that the major portion of the interface may correspond to modified (111) B crystallographic planes without significantly affecting the flat characteristic of the layers in the second region. This can be particularly advantageous in the fabrication of some semiconductor structures where for instance an improved device can be made by a technique incorporating a heating step which causes material transport at the interface before the layers of the second region are grown. An example of such a device can be a buried heterostructure laser. A technique incorporating a heating step, and a semiconductor structure made by the use of the technique, is described below. (The heating step acts to "clean up" the sides of a mesa so that improved growth of confinement layers against the mesa occurs, in spite of the treatment history of the mesa before growth.)

The term "modified (111) B crystallographic plane" means that the major portion of the interface has been fabricated by exposing a (111) B crystallographic plane in the material of the first region, then subsequently modifying the plane, for instance by heat treatment causing material transport, so that it no longer accurately represents a (111) B crystallographic plane. However, the interface will retain general characteristics of the (111) B crystallographic plane, for instance the overall direction of slope and the characteristic interaction with certain growth techniques, particularly MOVPE, which allows the layers in the second region to grow relatively evenly, right up to the interface.

Preferably the major portion of the interface comprises of the order of 60%, or more preferably of the order of 80%, of that interface. Also preferably, said major portion should comprise parts of the interface both adjacent to, and furthest from the substrate. Both these preferred features tend to encourage a generally flat characteristic of the layers grown against the interface.

According to a second aspect of the present invention there is provided a semiconductor structure, comprising a substrate having a mesa supported by a face thereof, the mesa comprising a p-n junction which extends parallel to the face of the substrate, the lateral surfaces of the mesa being buried by one or more confinement layers, wherein at least a major proportion of the lateral surfaces of the mesa correspond at least substantially to (111) B crystallographic planes of the material or materials of the corresponding part or parts of the mesa.

Semiconductor structures according to the second aspect of the present invention are particularly useful in buried heterostructure lasers.

Because semiconductor material such as InP can be used to grow surprisingly flat confinement layers against the lateral surfaces of such a mesa, for instance by means of MOVPE, the depth and positional relationship of the layers to a mesa can be relatively closely controlled. This is particularly important where the mesa contains a p-n junction and the confinement layers present an n-p junction to block current flow in use of a device. It can also be advantageous for subsequent steps in fabrication of a device.

As before, the (111) B crystallographic planes may be modified, for instance by heat treatment causing material transport.

It has been found that, as mentioned above, if the mesa incorporates an active layer of a device, the device may be improved by heating the structure, before growth of confinement layers against the lateral surfaces, so as to cause material transport onto the sides of the active layer. This is preferable to growing the confinement layers against the sides of the active layer directly after etching those sides, producing for instance a device with more reliable performance characteristics.

According to a third aspect of the present invention there is provided a method of making a semiconductor structure according to the first aspect of the present invention which comprises the stages of:

i) etching a wafer of semiconductor material to create a step having a rising surface, corresponding to the interface, at least a major portion of which surface comprises (111) B crystallographic planes of the material, and ii) growing semiconductor material by means of any one of a MOVPE, a MBE or a MOMBE technique to create the layer or layers of the second region.

The method may further comprise a stage in which the (111) B crystallographic planes are modified, for instance by heating to cause material transport at the interface, before the growth of the semiconductor material. To prevent growth on the layer or layers of the first region, an epitaxial growth suppressing material may be deposited on that layer or layers prior to stage ii) above.

According to a fourth aspect of the present invention there is provided a method of making a semiconductor structure according to the second aspect of the present invention which comprises the steps of:

i. forming a stripe of an epitaxial growth suppressing material on a heterostructure wafer;
ii. using the stripe as a mask, etching a mesa with an etchant or a selection of etchants such that at least a major proportion of the lateral surfaces of the mesa comprise (111) B crystallographic planes of the material of the mesa;
iii. using epitaxial growth to grow the confinement layers against the lateral surfaces of the mesa; and
iv. removing the stripe.

An important application of the present invention is in the production of lasers, particularly those which will operate in a single transverse mode. These lasers are of major importance in optical communication systems. Such lasers can be produced from semiconductor structures made by the method of the present invention in which the uppermost surface of the mesa is restricted to being not more than 5 $\mu$m wide.

Step iii. above may advantageously be preceded by a step in which the lateral surfaces of the mesa are modified by heat treatment which causes material transport at those surfaces.

MOVPE can be used as the epitaxial growth technique of step iv. above. This has the particular advantages already described.

Single transverse mode semiconductor lasers, and a waveguide, according to embodiments of the present invention will now be described, by way of example only, with reference to the accompanying Figures in which.

FIGS. 1 to 7, and 12, are not drawn to scale and cross hatching is omitted for the purposes of clarity.

As is the usual practice, although only one laser is shown in FIGS. 3a to 3f, several lasers will generally in fact be fabricated from the same wafer.

Figure 1:
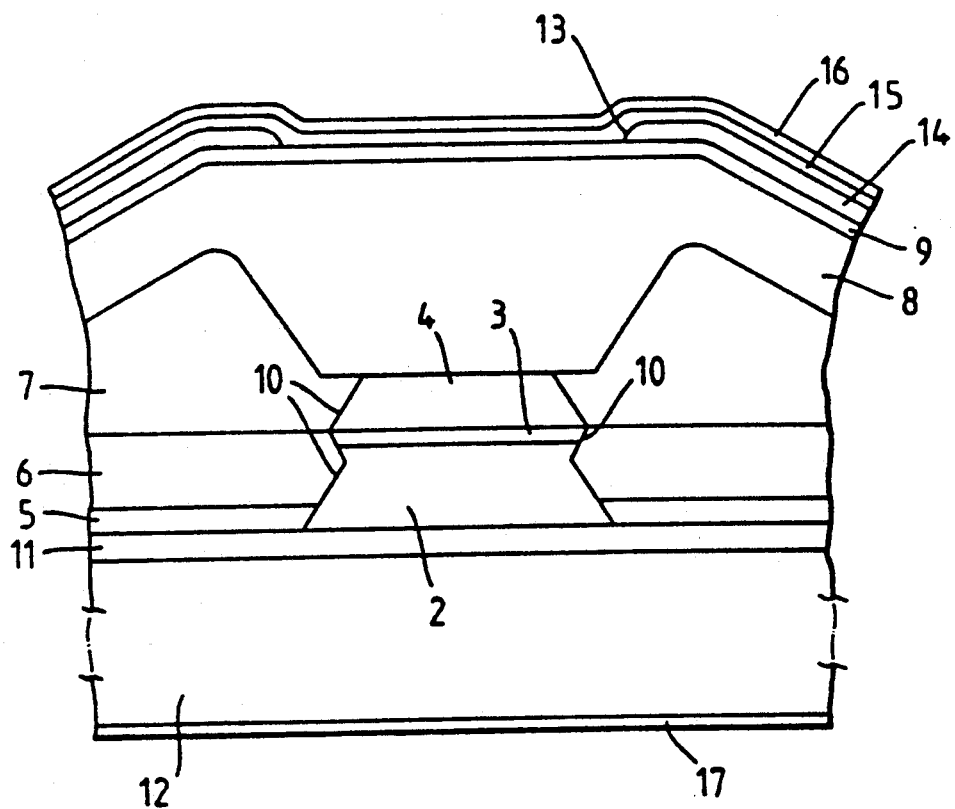
FIG. 1 shows a vertical cross section of a laser according to a first embodiment of the present invention.
Figure 2:
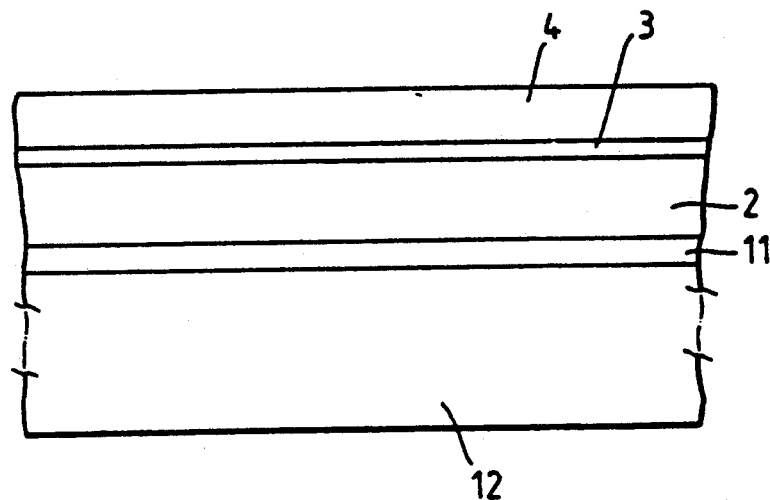
FIG. 2 shows a cross section of part of a double heterostructure wafer for use in making the laser of FIG. 1.

Referring to FIG. 1, a laser structure 1 according to an embodiment of the present invention comprises a layered mesa 2, 3, 4 buried by three confinement layers 5, 6, 7, a capping layer 8 and a contact layer 9. The lateral surfaces 10 of the mesa 2, 3, 4, against which the confinement layers 5, 6, 7 have been grown, are defined by (111) planes of the materials of the mesa 2, 3, 4. The resultant cross section of the mesa has a distinctive concertinalike appearance as a result.

In more detail, the laser structure 1 comprises a substrate 12 of (100) orientated S doped InP, doping level n approximately equal to $8 \times 10^{18}$ cm$^{-3}$, about 250 $\mu$m thick. Covering the upper surface of the substrate 12 is a quaternary layer 11 of S doped GaInAsP (quaternary material), doping level n of the order of 1 to $2 \times 10^{18}$ cm$^{-3}$, up to about 0.2 $\mu$m thick and of a band gap lying in the range from 1.0 to 1.3 $\mu$m. The layered mesa 2, 3, 4 is mounted on the quaternary material and has the following layers, starting with the lowermost:

i) an S-doped buffer layer 2 of InP, doping level n approximately equal to $2 \times 10^{18}$ cm$^{-3}$, 0.4 $\mu$m thick;
ii) an undoped active layer 3 of GaInAsP of band gap 1.5 $\mu$m and 0.1 $\mu$m thick; and
iii) a Cd-doped layer 4 of InP, doping level p approximately equal to $5 \times 10^{17}$ cm$^{-3}$, 0.2 $\mu$m thick.

On each side of the mesa is a series of three confinement layers 5, 6, 7 as follows, again starting with the lower most:

iv) an S-doped layer 5 of InP, doping level n of the order of 1 to $2 \times 10^{18}$ cm$^{-3}$, of thickness 0.1 $\mu$m;
v) a Cd-doped layer 6 of InP, doping level p approximately equal to $5 \times 10^{17}$ cm$^{-3}$, of approximate thickness 0.4 $\mu$m; and
vi) an S-doped layer 7 of InP, doping level n approximately equal to $1 \times 10^{18}$ cm$^{-3}$, of approximate thickness 0.4 $\mu$m.

Extending across the uppermost surfaces of both the mesa and the confinement layers 5, 6, 7 is a capping layer 8 of Cd-doped InP, doping level p approximately equal to $2 \times 10^{18}$ cm$^{-3}$, of thickness lying in the range 1 to 2 $\mu$m. The capping layer 8 in turn is covered by a ternary contact layer 9 of Zn-doped GaInAs, doping level p approximately equal to $4 \times 10^{19}$ cm$^{-3}$, of thickness lying in the range 0.05 to 0.3 $\mu$m.

Contacts, for providing driving current to the laser structure, are provided through a window 13 in a silica layer 14 over the contact layer 9, and to the lowermost surface of the substrate 12. The contacts 15, 16 and 17 comprise Ti Au tunnelling Schottky contacts applied by radio frequency sputtering and annealing. Pt may advantageously be included as a diffusion barrier between the Ti and the Au in the contact 15, 16 through the window 13. This contact configuration is known and further details are not therefore provided herein.

Referring to FIGS. 2 and 3a to 3f, in a method of fabricating a laser structure according to FIG. 1, firstly a double heterostructure wafer is produced. The wafer (shown in FIG. 2) comprises the substrate 12, the quaternary layer 11, and the layers 2, 3, 4 which are present in the mesa of the finished laser structure.

The layers 11, 2, 3, 4 are all lattice-matched to the respective layer below, being grown by MOVPE under normal growth conditions.

A silox stripe 18, 1.8 µm wide and 0.2 µm thick (shown in FIGS. 3a to 3e), is then produced extending in the (110) direction with respect to the crystalline structure of the substrate 12. The stripe 18 is produced by the use of the known combination of a positive photoresist mask and buffered HF as an etchant.

Etching the wafer, which comprises layers of different semi-conductor materials which must each be etched to produce the layered mesa 2, 3, 4, must be carried out using different selective etchants. The uppermost, InP layer 4 is etched using hydrobromic acid. The active layer 3 is etched using a mix of sulphuric acid, hydrogen peroxide and water. The InP buffer layer 2 is etched by again using hydrobromic acid. The actions of these etchants in this crystallographic orientation are well documented.

Alternatively the active layer 3 may be etched using a mixture of potassium dichromate (1/6 molar), sulphuric acid, and hydrochloric acid in the ratio 3:1:1. The action of this etchant is further discussed below.

Figure 3A:
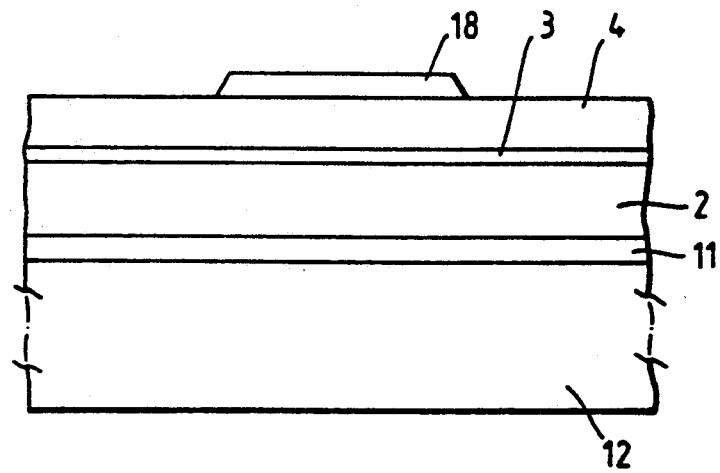
FIGS. 3a to 3f show stages in production of the laser of FIG. 1.
Figure 3B:
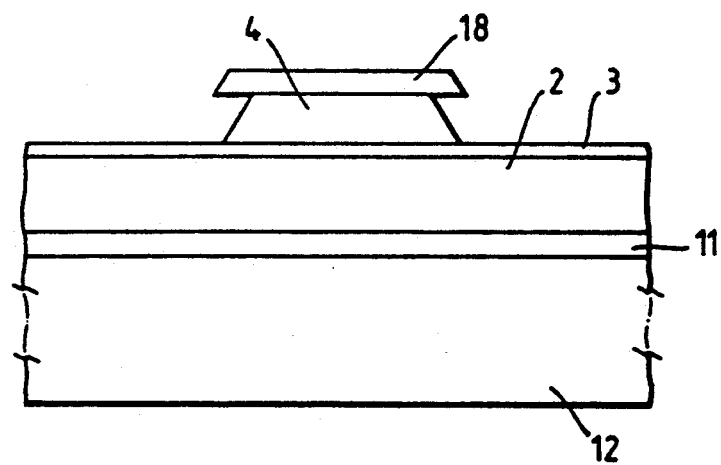

The hydrobromic acid etches through the uppermost InP layer 4 at a rate of about 6 µm per minute of InP at 20° C., or 2.5 µm per minute at 5° C., being stopped by the quaternary active layer 3. When the active layer 3 is reached, the etch rate drops significantly for instance by a factor of 3 or 4. Referring to FIG. 3b, the characteristic result at this stage is a shallow mesa profile with sides formed largely, or entirely, by (111) B planes. If the silox stripe 18 is well adhered to the InP layer 4, the planes exposed by the etchant are (111) A immediately below the silox stripe 18, then (111) B down to the active layer 3. The ratio of A to B planes (in terms of the depth of the mesa showing each type of plane at this stage) has been observed to be about 1:4. If the silox stripe 18 is not well adhered, then the only plane exposed is generally the (111) B plane. FIG. 3b shows a mesa profile where the silox stripe 18 was not well adhered. In the latter case, as shown, there is a slight undercut, generally of up to 0.2 µm, of the silox stripe 18.

It was noted that in some cases the hydrobromic acid contained colloidal particles. These were removed by filtration.

Figure 3C:
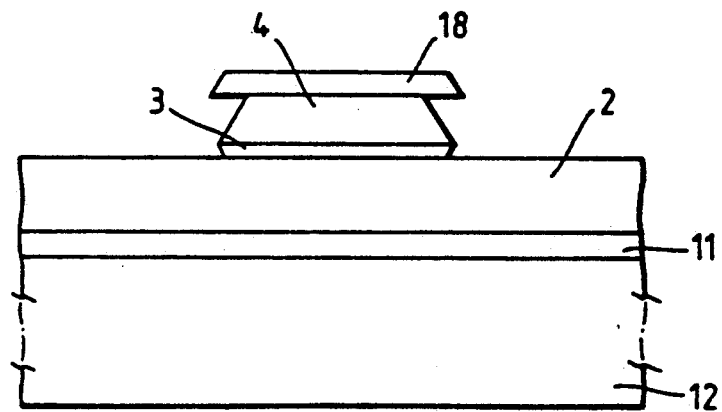

Using the acid/peroxide mixed etchant, the active layer 3 is then etched. The mixed etchant etches at a rate of 0.4 µm per minute and is stopped by the InP buffer layer 2. Referring to FIG. 3c, the sidewalls of the active layer 3 are characteristically etched to expose (111) A planes by this process. Hence at this stage a mesa has been formed which has an angular "bulge" in its sidewalls.

As mentioned above, the active layer 3 can alternatively be etched using a dichromate acid etchant. This etchant has the advantages of etching all wavelengths of quaternary material between InGaAs and InP, and of etching the active layer 3 only relatively slowly in a lateral direction once the (111) A plane has been exposed. Because of the latter feature, over etching of the active layer 3 does not cause deep undercutting of the uppermost InP layer 4. It has been found that the dichromate/acid etchant etches quaternary material of emission wavelength 1.5 µm at a rate of about 0.8 µm per minute in a downwards direction at 5° C. However the etch time for the active layer 3 in the present case has been found to tend to be variable where there is lattice mismatch in the double heterostructure wafer. An etch time of 60 secs is used to ensure complete clearance of the active layer 3. (If the active layer 3 comprises a quaternary material having a band gap of 1.3 µm, then an etch time of 10 mins has been found suitable).

Figure 3D:
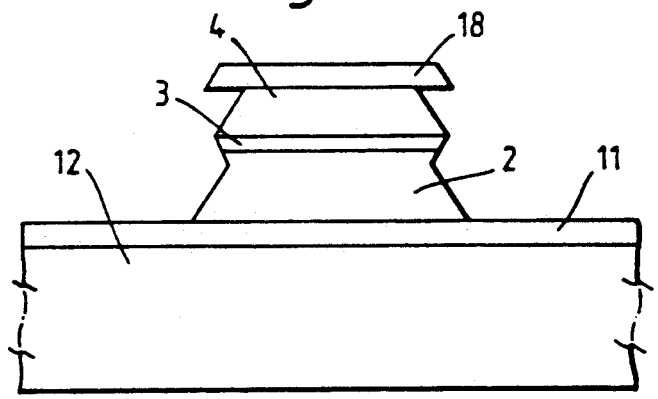

Reverting to hydrobromic acid as the etchant, the InP buffer layer 2 is then etched until the quaternary layer 11 which covers the substrate 12 stops the action of the etchant. Referring to FIG. 3d, the resultant layered mesa 2, 3, 4 has the characteristic concertinalike appearance referred to above. If the active layer 3 has been overetched, this final etching step has been found to cut the uppermost InP layer 4 back rapidly, but only as far as the top corner of the (111) A plane in the active layer 3. Hence the same mesa 2, 3, 4 profile is achieved, though the degree of overetching will affect the mesa width.

It has been noted that during the final etching step, the active layer 3 appears to act as a strongly adherent mask and the InP buffer layer 2 is at first etched along (111) A planes before the (111) B plane reasserts itself. This means that the angle produced in the mesa sidewall by the transition from A back to B planes does not coincide with the interface between the active and buffer layers 3, 2. This can be seen for instance in FIG. 3d.

Figure 3E:
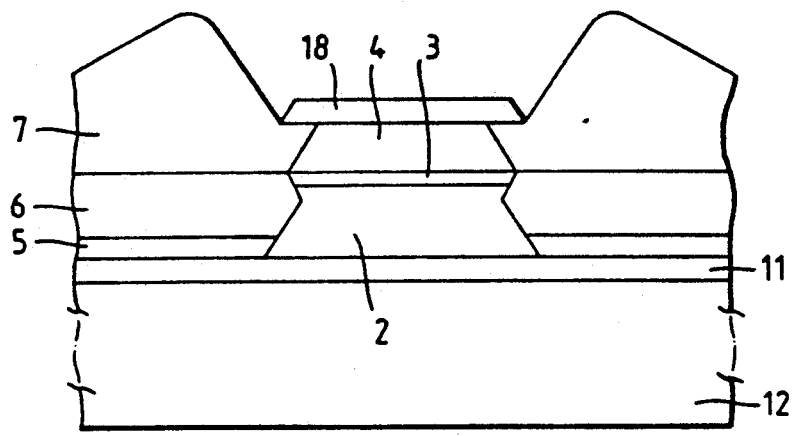

After etching of the layered mesa 2, 3, 4, the three confinement layers 5, 6, 7 are grown in. The action of the silox stripe 18 during this stage is to suppress growth of InP. Referring to FIG. 3e, the result is that the confinement layers 5, 6, 7 grow either side of the mesa leaving the silox stripe 18 exposed.

Growth conditions for the confinement layers are generally as are normal for MOVPE growth but before growth starts, the sample is heated to 700° C. for 20 minutes in the presence of PH$_3$. This treatment has been found to enhance the action of the silox as a MOVPE growth-suppressing material even when the silox stripe is reduced in width for instance to values as low as about 1 µm. Further, the heating involved appears to allow surface reconstruction to occur which improves the morphology of subsequently grown epitaxial layers. This surface reconstruction can be significant, modifying the lateral surfaces of the mesa by means of material transport particularly at the base of the mesa, and onto the exposed surfaces of the active layer. The concentration of PH$_3$ should be high enough to prevent incongruous evaporation of the InP. The period for which the sample must be heated in the presence of PH$_3$ will vary according to the conditions applied. For instance, if the concentration of PH$_3$ is increased, the period may be reduced.

Where the uppermost InP layer 4 had been etched so as to undercut the silox stripe 18, it was noted that high device yields were achieved. This was because the silica overhang forces the confinement layers to "wing", or flare away, from the bottom surface of the silox stripe 18. Consequently few overgrowth bridges occur, where the confinement layers meet above the silox stripe 18. Such winging occurs even in the absence of an overhang but it is enhanced where an overhang is present.

Figure 3F:
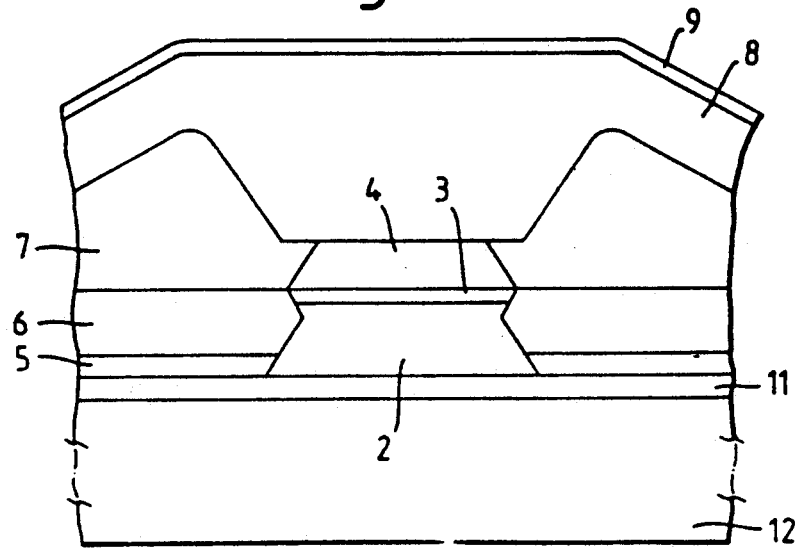

Referring to FIG. 3f, when the confinement layers 5, 6, 7 are complete, the silox stripe is removed in a 40% aqueous solution of HF and the capping and contact layers 8, 9 are grown, again by MOVPE.

Figure 4:
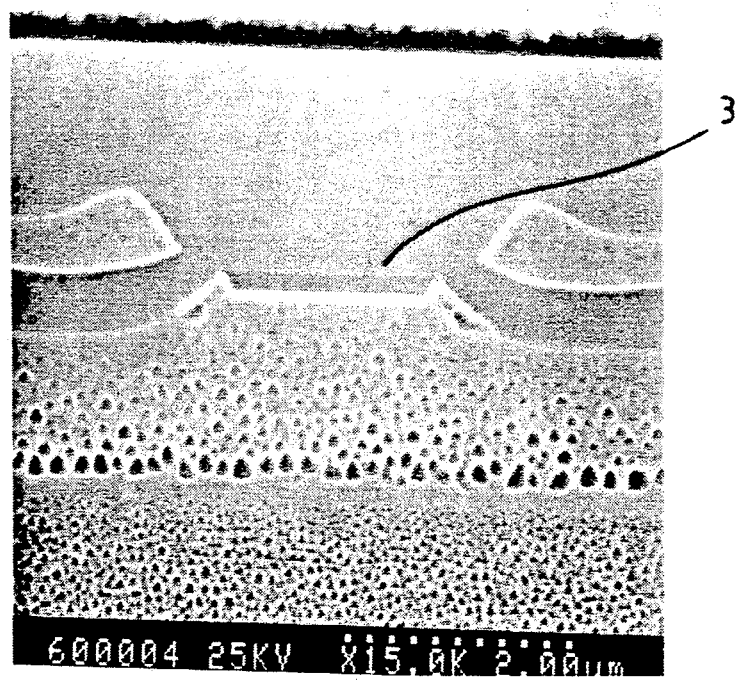
FIG. 4 shows a scanning electron microscope image of a cross section of a semiconductor structure according to an embodiment of the present invention.

Referring to FIG. 4, it is possible to see, using a scanning electron microscope, that significant mass transport may take place onto the sides of the active layer 3 in a mesa during the heating step prior to growing the confinement layers.

To complete the laser as shown in FIG. 1, the contacts 15, 16, 17 are applied by conventional techniques. It can then be conveniently mounted on a heat sink (not shown) by soldering the heat sink to the Au layer of the contact 15, 16.

The laser described above with reference to FIGS. 1 to 3f has a number of advantageous features. Firstly, the confinement layers 5, 6, 7 tend to grow in substantially planar, particularly at a distance down the lateral surfaces of the mesa 2, 3, 4 of more than 0.5 $\mu$m from the silox stripe 18. Further, as mentioned above, the uppermost confinement layer 7 tends to "wing" away from the silox stripe 18, leaving a wide opening which gives good access for subsequent removal of the stripe 18. The capping and contact layers 8, 9 tend to grow with a planar characteristic which facilitates heat sinking and, also, at least two semiconductor junctions are ingrown by consecutive growth steps into the confinement layers 5, 6, 7. This avoids having junctions coincident with layer interfaces which have been chemically degraded for instance by the use of etchants.

Particularly advantageous is the novel use of a first quaternary layer 11, independent of the active layer 3, on the substrate 12. This acts as a stopping layer to the etchant used to etch the lowermost mesa layer 2. It also acts to prevent breakdown, even at large gate currents, of the p-n-p-n thyristor-like structure of the confinement layers 5, 6, 7 in combination with the capping layer 8. As a result leakage currents are blocked which would otherwise bypass the active region of the laser in use. By using a first quaternary layer 11 which is independent of the active layer 3, its characteristics such as band gap are not tied to those of the active layer 3. By reducing the bandgap, for instance to values in the range 1.0 to 1.3 $\mu$m as described above, the effectiveness of the first quaternary layer 11 in preventing leakage currents may then be improved.

The first quaternary layer 11 has even a third function, as part of the waveguiding structure of the laser. As long as the buffer layer 2 of the mesa is sufficiently thin, the first quaternary layer 11 can "dilute" the lateral refractive index step at the sides of the mesa, allowing wider mesas with the same mode cut-off properties. This is desirable for processing, device resistance and radiation beam width reasons. In addition the first quaternary layer 11 could have distributed feedback (DFB) gratings etched into it, planar growth being resumed to deposit the layers 2, 3 and 4 of the mesa. (Again the buffer layer 2 should be relatively thin, say from 0.1 to 0.5 $\mu$m thick, to allow the desired degree of optical interaction).

The use of a first quaternary layer in a semiconductor laser structure, independent of the active layer, lying above the substrate and extending below the mesa, may be found advantageous more generally than in structures of the type described in the present specification.

Figure 5:
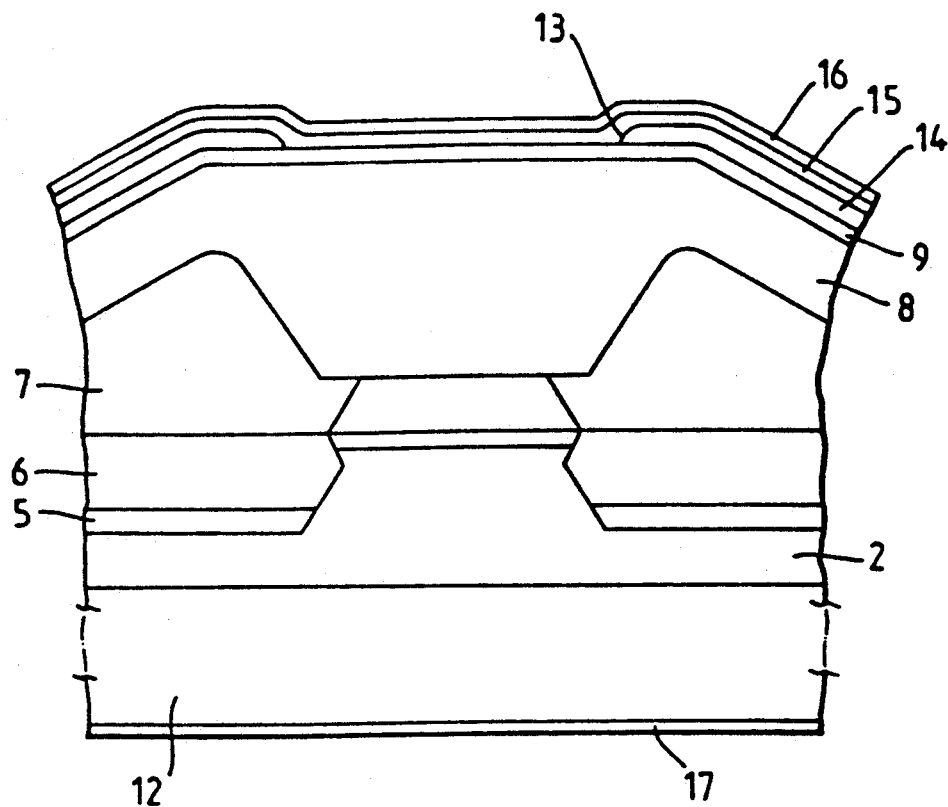
FIGS. 5 and 7 show cross sections of semiconductor lasers according to second and third embodiments of the present invention.

Referring to FIG. 5, variations may be made in the layers of the laser structure. For instance the first quaternary layer 11 may be left out and a deeper buffer layer 2 used, the layered mesa 2, 3, 4 extending only partially down into the buffer layer 2. The final etching step, in which the buffer layer 2 is etched, will then have to be controlled by timing rather than by relying on the action of the first quaternary layer 11 as a stopping layer.

Figure 6:
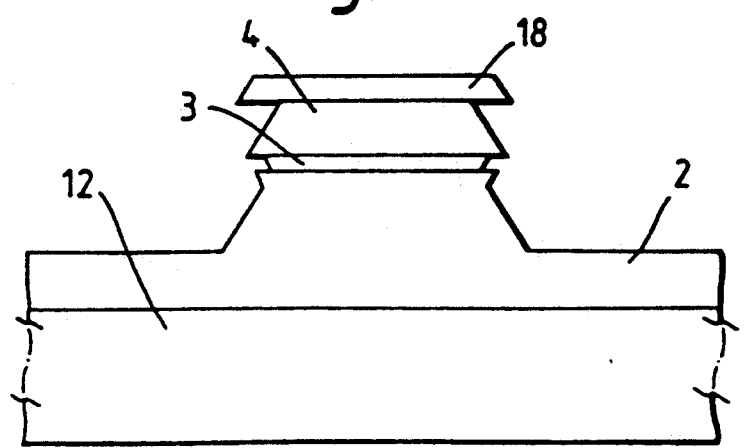
FIG. 6 shows a stage in the production of a laser according to an embodiment of the present invention, following an optional additional treatment step.

Referring to FIG. 6, it has been found advantageous to "notch" the active layer 3 immediately before heating and growth of the confinement layers. An etchant which attacks only the active layer 3, and which selectively exposes the (111) A planes, is used to narrow the active layer 3 preferentially. A suitable etchant comprises sulphuric acid, hydrogen peroxide, and water in the ratio 3:1:1. This "notching" of the active layer 3 is believed to provide a clean, fresh surface on the side of the active layer 3, which benefits the subsequent process steps.

Other variations may be that the unetched thickness of the buffer layer 2 may conveniently range up to 4 $\mu$m, and the height of the layered mesa 2, 3, 4 may be as much as 1.4 $\mu$m. Different dopants and doping levels may be used, such as Zn instead of Cd in the uppermost layer 4 of the mesa, doped to a level of $2 \times 10^{18}$ cm$^{-3}$ instead of $5 \times 10^{17}$ cm$^{-3}$.

The second of the confinement layers 6 may comprise a "semi-insulating" material such as Fe doped InP instead of the p-doped InP referred to above. Such a material tends to have a relatively high resistivity.

The silox stripe 18 might be replaced by a stripe of different material, such as a different form of silica, or another dielectric material such as $Si_3N_4$ or alumina.

Figure 7:
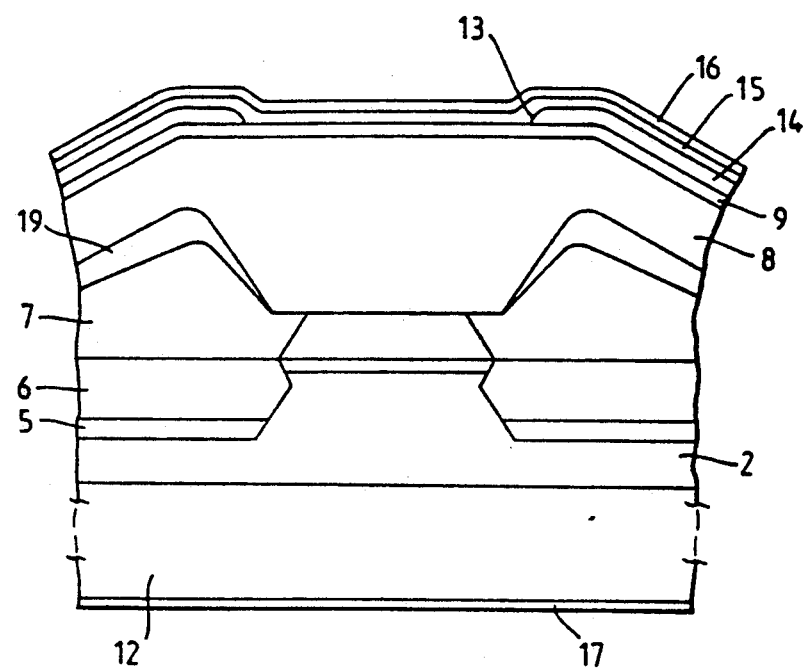

Referring to FIG. 7, an additional p-doped layer 19 of InP may be grown onto the confinement layers 5, 6, 7. This avoids coincidence between the uppermost p-n junction provided by the confinement layers 5, 6, 7 and a chemically treated interface such as the interface between the confinement layers and the capping layer 8, which may be degraded during removal of the silox stripe 18.

The detailed growth of InP confinement layers by MOVPE against a layered mesa 2, 3, 4 of the type shown in FIG. 5 has been investigated by growing alternating layers of p- and n-doped InP and using a scanning electron microscope (SEM) to obtain images of the layers. It was noted that there were no voids on the sides of the mesa, or under the overhang of the silox stripe 18 at least for an overhang of up to 0.2 $\mu$m. The most interesting feature was the growth of the confinement layers parallel to the (100) plane. Only when the confinement layers were approaching within 0.2 $\mu$m of the silox stripe 18 did they begin to thicken preferentially at the points of contact with the mesa sidewalls.

Figure 8:
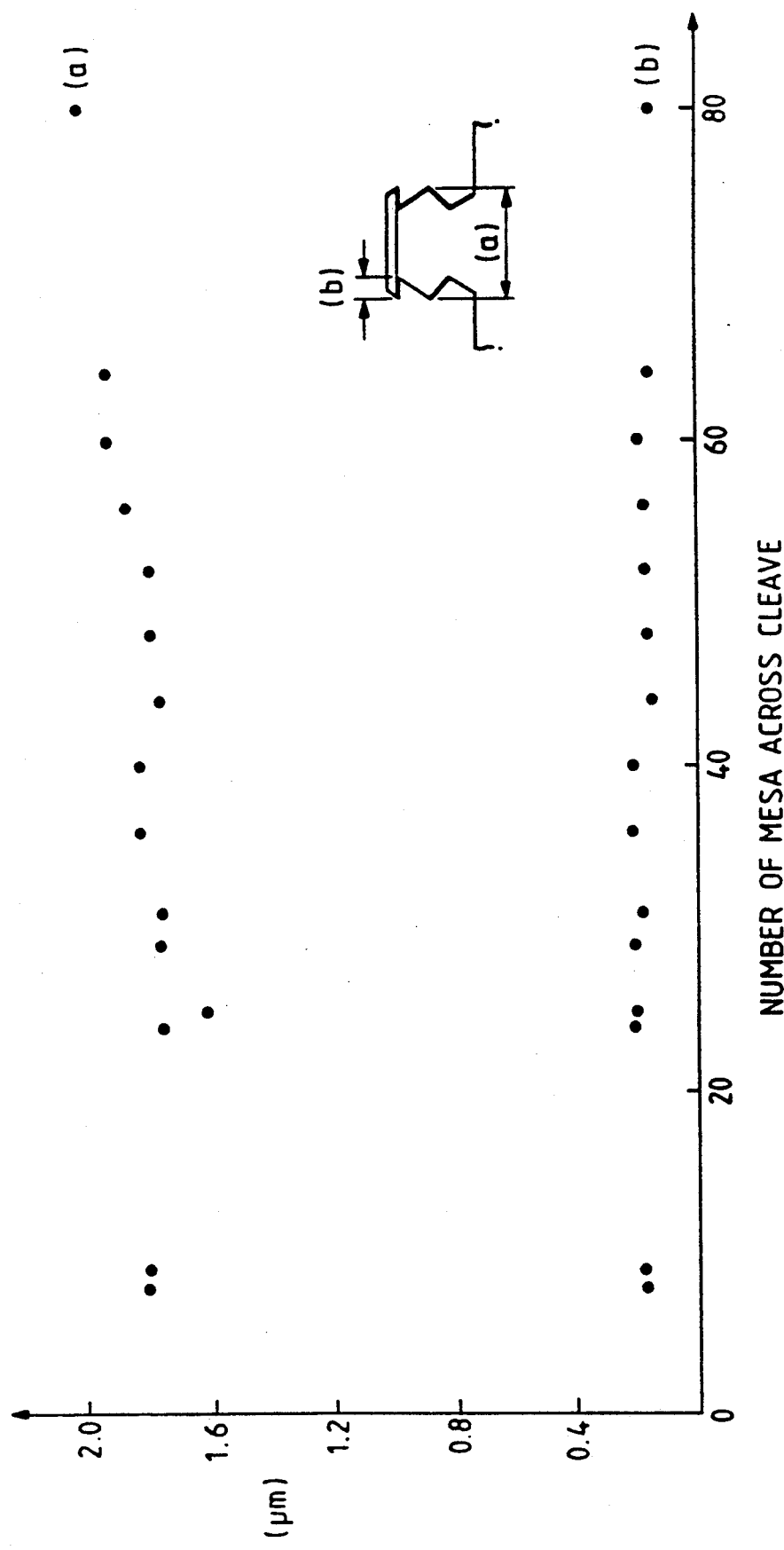
FIG. 8 shows a plot of the dimensions of a plurality of mesas fabricated from a common wafer according to embodiments of the present invention.

Referring to FIG. 8, the uniformity of a plurality of mesas produced on a single wafer was investigated by taking a cleave from one end of the wafer and examining mesa dimensions using an SEM. The approximate size of the wafer was 10 mm $\times$ 12 mm. All of the mesa dimensions were found to have been controllable to within 0.1 $\mu$m. The wafer was subsequently overgrown with confinement layers and only an insignificant number of bridges of the silox stripes could be visually observed.

Lasers fabricated according to embodiments of the present invention have produced up to 50 mW under direct current (dc) operation. The electrical characteristics have shown no appreciable conduction of current through the confinement layers due to mesa or overgrowth defects.

Figure 9:
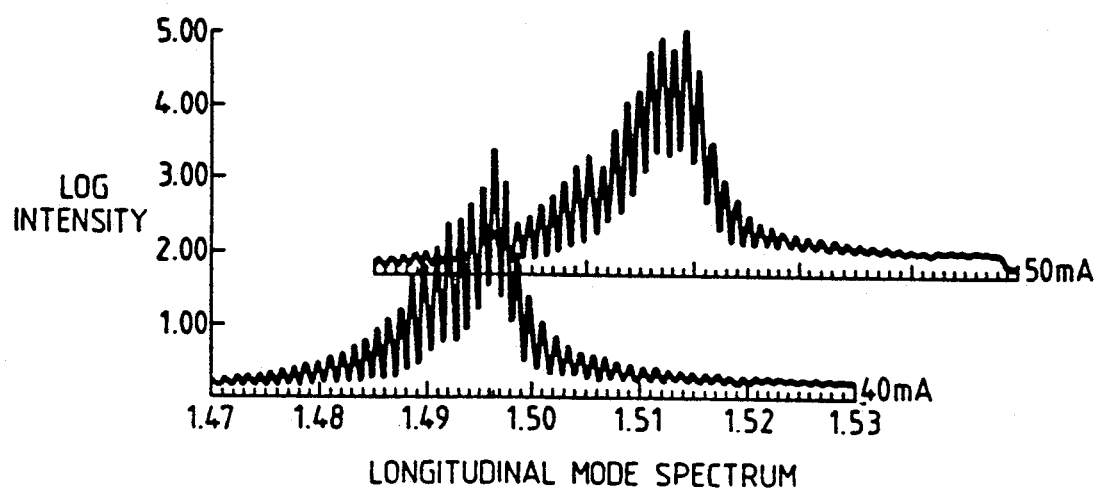
FIG. 9 shows a longitudinal mode spectrum of a laser structure as shown in FIG. 5.

Referring to FIG. 9, a longitudinal mode spectrum of a laser of the type shown in FIG. 5, using n-, p- and n-doped confinement layers 5, 6, 7, has been found to show a smooth envelope of modes and no evidence of higher order transverse modes.

Figure 10A:
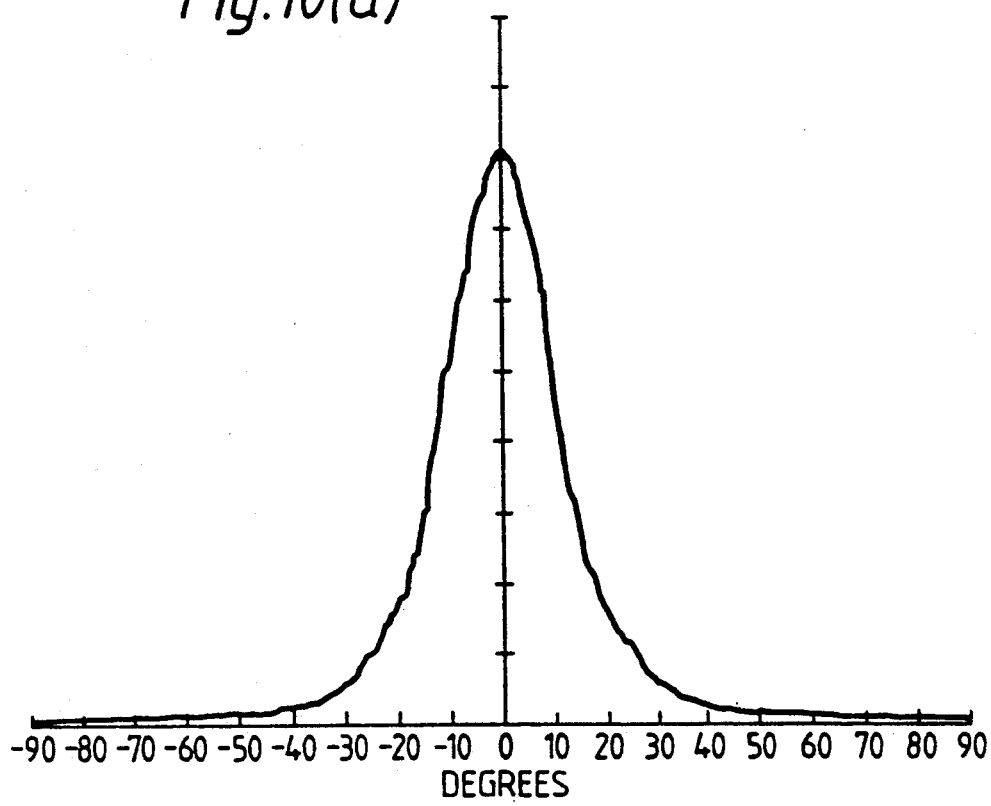
FIGS. 10a and 10b show the far field patterns parallel and perpendicular respectively to the plane of the p-n junction of the mesa.
Figure 10B:
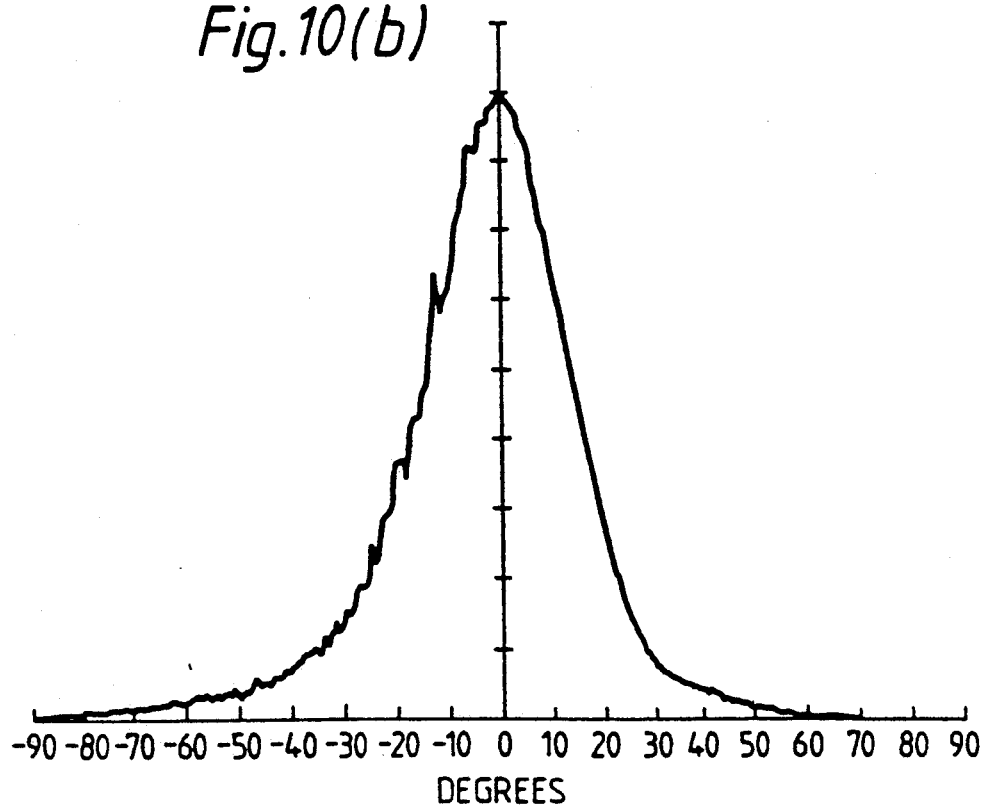

Referring to FIGS. 10a and 10b, far field spectra from such a laser have been found to show a full width at half maximum (fwhm) of 24° for the parallel direction and 30° for the perpendicular direction, with reference to the plane of the active layer. The far field spectra were also relatively smooth. It is considered that the smooth condition of the mesa sidewalls led to the smoothness of the far field spectra.

Figure 11:
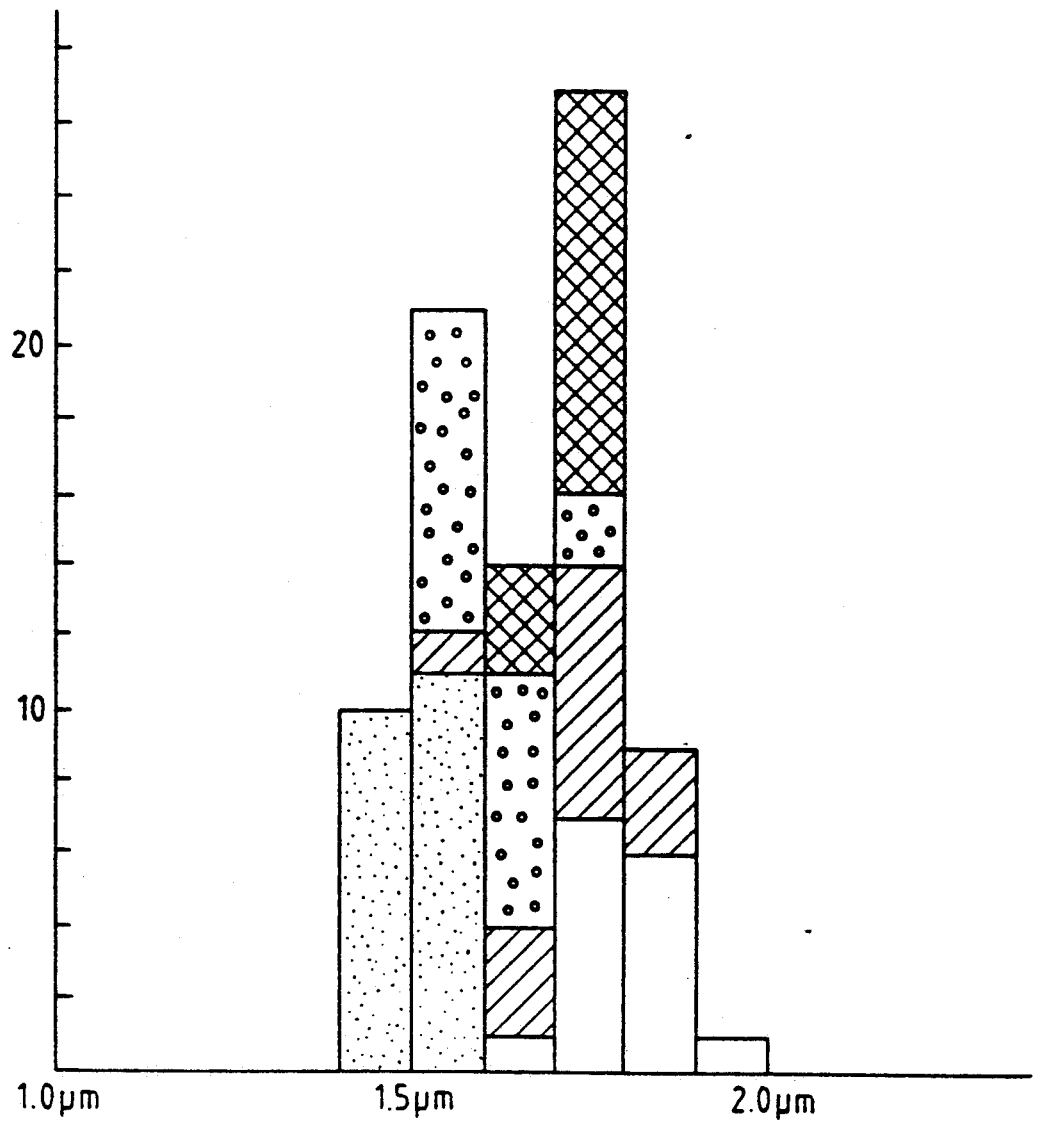
FIG. 11 shows a histogram of active layer widths in mesas produced using methods according to the present invention, sampled from five different wafers.

Referring to FIG. 11, the width of the active layer was measured in 80 different mesas, produced over five different wafers. Using silox stripes of 2.0 µm and 1.85 µm width, the active layer widths ranged from 1.4 µm to 1.9 µm, with one active layer width lying in the range from 1.9 µm to 2.0 µm. The active layer widths achieved on each wafer are shown as a histogram on FIG. 11, differentiated as indicated by the markings within the columns of the histogram.

Although the embodiments of the present invention described above are fabricated using MOVPE, this could be replaced by MBE or MOMBE, although some changes in process conditions might then be necessary.

Figure 12:
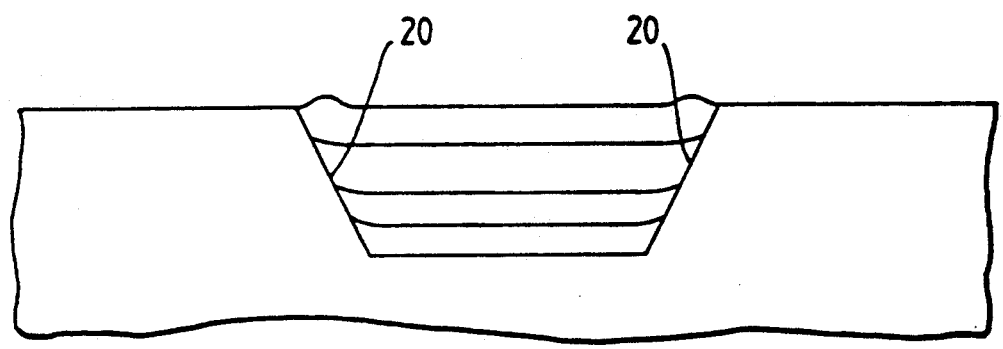
FIG. 12 shows a waveguide according to an embodiment of the present invention.

Referring to FIG. 12, semiconductor structures other than lasers can be fabricated as embodiments of the present invention. As shown in the Figure, instead of a mesa, a channel might be created, the sides 20 of the channel being provided by (111) B crystallographic planes. If material is subsequently grown into the channel in layers having a substantially flat characteristic almost right up to the sides 20 of the channel, then a particularly useful waveguiding structure can be created.

The material grown into the channel may comprise a quaternary, InGaAsP, and the material into which the channel is created may comprise InP.

Other semiconductor structures which could beneficially be made according to embodiments of the present invention are optical detectors and opto-electronic integrated circuits (OEICS).

We claim:

1. A method of making a semiconductor structure which comprises the stages of:
   i) etching a wafer of semiconductor material to create a mesa having side surfaces, at least a major portion of each side surface comprising a (111) B crystallographic plane of the material of the wafer; and
   ii) preferentially growing one or more layers of semiconductor material by a MOVPE, a MBE or a MOMBE technique onto the etched surface of the wafer, to meet the side surfaces of the mesa, the surface of said one or more layers being substantially flat adjacent and right up to said side surfaces.

2. A method according to claim 1, wherein stage i) is carried out using a mask of an epitaxial growth suppressing material to create the mesa, the mask being subsequently used to achieve the preferential growth of step (ii).

3. A method according to either one of claims 1 or 2 which further comprises a stage in which the (111) B crystallographic plane is modified prior to step (ii).

4. A method of making a semiconductor structure which comprises the steps of:
   i) forming a stripe of an epitaxial growth suppressing material on a heterostructure wafer;
   ii) using the stripe as a mask, etching a mesa to expose (111) B crystallographic planes over at least a major portion of the lateral surfaces of the mesa;
   iii) using epitaxial growth to grow one or more confinement layers against each lateral surface of the mesa, at least one of said confinement layers having a substantially flat surface in the region adjacent the respective lateral surface; and
   iv) removing the stripe.

5. A method of making a semiconductor structure which comprises the steps of:
   i forming a stripe of an epitaxial growth suppressing material on a heterostructure wafer;
   ii using the stripe as a mask, etching a mesa with at least one etchant to expose (111) B crystallographic planes over at least a major portion of the lateral surfaces of the mesa;
   iii modifying the exposed (111) B crystallographic planes by heat treatment sufficient to cause material transport at the lateral surfaces of the mesa;
   iv using epitaxial growth to grow confinement layers against the lateral surfaces of the mesa; and
   v removing the stripe.

6. A method according to either one of claims 4 or 5, wherein the stripe comprises a MOVPE growth suppressing material and the confinement layers are grown by MOVPE.

7. A method for making a semiconductor structure comprising the steps of:
   i) forming a mask of epitaxial growth suppressing material on a heterostructure wafer;
   ii) etching the wafer to create a rising surface, the major portion of the rising surface having an exposed (111) B crystallographic plane, and
   iii) modifying the exposed (111) B crystallographic plane of the rising surface by heat treatment, and
   iv) growing epitaxial layers of semiconductor material by MOVPE, MOCVD, MBE or MOMBE techniques onto the etched surface of the wafer so that the epitaxial layers meet the rising surface.

8. A method of making a semiconductor structure comprising a substrate of semiconductor material having epitaxial layers grown thereon, the structure having an interface between first and second regions of the layers, and the interface extending generally transversely with respect to the face of the substrate, the method of comprising the stages of:
   i) etching the epitaxial layers with at least one etchant to create an etched surface and a step having a rising surface corresponding to the interface, at least a major portion of the rising surface comprising (111) B crystallographic planes of the material of the epitaxial layers; and
   ii) preferentially growing more than one layer of semiconductor material, by means of a MOVPE, MBE or MOMBE technique onto the etched surface, to meet the rising surface of the step, wherein said epitaxial layers are doped so as to provide a p-n junction which meets said rising surface and said layers of semiconductor material are doped so as to provide a blocking junction with respect to said p-n junction, which blocking junction meets said rising surface.

9. A method according to claim 8, wherein stage i) is carried out using a mask of an epitaxial growth-suppressing-material to create the step, the mask being left in place during stage i) thereby to achieve the preferential growth of stage ii).

10. A method according to claim 8 or 9, further comprising a stage of modifying the (111) B crystallographic plane by heat treatment sufficient to cause material transport at the interface prior to stage ii).

11. A method according to claim 8, wherein there are at least two epitaxial layers of different composition and different etching properties, and at least two different etchants are used in stage i).

12. A method of making a semiconductor structure comprising the steps of:
   i) forming a stripe of an epitaxial-growth-suppressing material on a heterostructure wafer;
   ii) using the stripe as a mask, etching a mesa with at least one etchant so as to expose (111) B crystallographic planes over at least a major portion of the lateral surfaces of the mesa;
   iii) preferentially growing semiconductor material, by means of a MOVPE, MBE or MOMBE technique, to grow confinement layers against the lateral surfaces of the mesa; and
   iv) removing the stripe.

13. A method according to any one of claims 1, 4 or 12 wherein said mesa comprises a p-n junction and said one or more layers of semiconductor material, or said confinement layers, provide a current blocking semiconductor junction with respect to said p-n junction.

* * * * *